(12) United States Patent
Cook et al.

(10) Patent No.: US 10,593,509 B2
(45) Date of Patent: Mar. 17, 2020

(54) CHARGED PARTICLE BEAM DEVICE, MULTI-BEAM BLANKER FOR A CHARGED PARTICLE BEAM DEVICE, AND METHOD FOR OPERATING A CHARGED PARTICLE BEAM DEVICE

(71) Applicant: ICT Integrated Circuit Testing Gesellschaft für Halbleiterprüftechnik mbH, Heimstetten (DE)

(72) Inventors: Benjamin John Cook, München (DE); Dieter Winkler, München (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 0 days.

(21) Appl. No.: 16/037,842

(22) Filed: Jul. 17, 2018

(65) Prior Publication Data
US 2020/0027687 A1  Jan. 23, 2020

(51) Int. Cl.
| H01J 37/04 | (2006.01) |
|---|---|
| H01J 37/09 | (2006.01) |
| H01J 37/147 | (2006.01) |
| H01J 37/244 | (2006.01) |
| H01J 37/26 | (2006.01) |

(52) U.S. Cl.
CPC ............ *H01J 37/045* (2013.01); *H01J 37/09* (2013.01); *H01J 37/147* (2013.01); *H01J 37/244* (2013.01); *H01J 37/26* (2013.01); *H01J 2237/043* (2013.01); *H01J 2237/0453* (2013.01); *H01J 2237/2448* (2013.01)

(58) Field of Classification Search
CPC ........ H01J 37/045; H01J 37/09; H01J 37/147; H01J 37/244; H01J 37/26; H01J 2237/043; H01J 2237/0453; H01J 2237/2448

USPC ......... 250/396 R, 397, 492.1, 492.2, 492.21, 250/492.22, 492.23, 492.3
See application file for complete search history.

(56) References Cited

U.S. PATENT DOCUMENTS

| 2004/0141169 A1 | 7/2004 | Wieland et al. |
|---|---|---|
| 2005/0242303 A1 | 11/2005 | Platzgummer |
| 2007/0057204 A1 | 3/2007 | Kruit et al. |
| 2008/0283767 A1 | 11/2008 | Platzgummer |
| 2009/0200495 A1 | 8/2009 | Platzgummer |
| 2010/0038554 A1 | 2/2010 | Platzgummer et al. |
| 2010/0127185 A1 | 5/2010 | Fragner et al. |
| 2010/0276606 A1 | 11/2010 | Baars et al. |

(Continued)

OTHER PUBLICATIONS

U.S. Appl. No. 16/037,815 Notice of Allowance dated Jun. 21, 2019, 12 pages.

*Primary Examiner* — Nicole M Ippolito
(74) *Attorney, Agent, or Firm* — Kilpatrick Townsend & Stockton LLP

(57) ABSTRACT

A multi-beam charged particle beam device is described. The multi-beam charged particle beam device includes a charged particle source configured to emit a primary charged particle beam; an aperture arrangement having openings configured to generate at least a first beamlet and a second beamlet of the primary charged particle beam; and a blanking device, the blanking device includes at least a first blanking deflector for the first beamlet and a second blanking deflector for the second beamlet; and a shield assembly having a first shielding element partially or fully surrounding the first blanking deflector.

22 Claims, 6 Drawing Sheets

(56) References Cited

U.S. PATENT DOCUMENTS

| | | |
|---|---|---|
| 2011/0073782 A1 | 3/2011 | Wieland |
| 2012/0268725 A1 | 10/2012 | De Boer et al. |
| 2012/0286168 A1 | 11/2012 | Derks et al. |
| 2012/0286169 A1 | 11/2012 | Van de Peut et al. |
| 2012/0286173 A1 | 11/2012 | Van de Peut et al. |
| 2012/0287410 A1 | 11/2012 | Wieland et al. |
| 2012/0287411 A1 | 11/2012 | Vergeer et al. |
| 2012/0292491 A1 | 11/2012 | Wieland et al. |
| 2014/0367586 A1 | 12/2014 | Frosien et al. |
| 2015/0177625 A1 | 6/2015 | De Boer et al. |
| 2015/0242563 A1 | 8/2015 | Wieland |
| 2015/0347660 A1 | 12/2015 | Platzgummer et al. |
| 2016/0071696 A1 | 3/2016 | Kuiper et al. |
| 2017/0186582 A1 | 6/2017 | Steenstra |
| 2017/0345612 A1* | 11/2017 | Touya .................. H01J 37/045 |
| 2017/0357153 A1 | 12/2017 | Platzgummer |
| 2019/0066972 A1 | 2/2019 | Frosien |

\* cited by examiner

CHARGED PARTICLE BEAM DEVICE, MULTI-BEAM BLANKER FOR A CHARGED PARTICLE BEAM DEVICE, AND METHOD FOR OPERATING A CHARGED PARTICLE BEAM DEVICE

FIELD

Embodiments of the present disclosure relate to a charged particle beam device, a multi-beam blanker for a charged particle beam device, particularly a multi-beam blanker per beamlet of a multi-beam single column charged particle beam device, and a method for operating a charged particle beam device. Embodiments of the present disclosure particularly relate to electron beam inspection (EBI).

BACKGROUND

Charged particle beam devices have many functions in a plurality of industrial fields, including, but not limited to, electron beam inspection (EBI), critical dimension (CD) measurements of semiconductor devices during manufacturing, defect review (DR) of semiconductor devices during manufacturing, exposure systems for lithography, detecting devices and testing systems. Thus, there is a high demand for structuring, testing and inspecting specimens within the micrometer and nanometer scale. Micrometer and nanometer scale process control, inspection or structuring can be done with charged particle beams, e.g. electron beams, which are generated and focused in charged particle beam devices, such as electron microscopes. Charged particle beams offer superior spatial resolution compared to, for example, photon beams due to the short wavelengths.

High throughput electron beam inspection (EBI) systems can utilize multi-beam charged particle beam devices, such as electron microscopes, that are able to create, focus and scan multiple primary charged particle beams inside a single column of the charged particle beam device. A sample can be scanned by an array of focused primary charged particle beams or beamlets, which in turn create multiple signal charged particle beams. The individual signal charged particle beams can be mapped onto detection elements.

The throughput of single beam electron inspection at high resolution is reaching a limit. A solution can be provided by multiple electron beams. Generally, there are different approaches, namely providing multiple single-beam columns, a single column having multiple charged particle beamlets, or multiple columns with multiple charged particle beamlets.

Charged particle inspection systems tend to charge non-conductive areas on the sample or specimen. Charging of non-conductive areas may cause image degradation of the imaging characteristics for the surrounding conductive areas. Furthermore, sensitive areas may be damaged by electron beam irradiation.

In view of the above, improved charged particle beam devices and improved methods for operating a charged particle beam device that overcome at least some of the problems in the art are beneficial.

SUMMARY

In light of the above, a charged particle beam device, a blanker for multiple beams for a charged particle beam device, and a method for operating a charged particle beam device are provided. Further aspects, benefits, and features of the present disclosure are apparent from the claims, the description, and the accompanying drawings.

According to an aspect of the present disclosure, a multi-beam charged particle beam device is provided. The multi-beam charged particle beam device includes a charged particle source configured to emit a primary charged particle beam; an aperture arrangement having openings configured to generate at least a first beamlet and a second beamlet of the primary charged particle beam; and a blanking device, the blanking device includes at least a first blanking deflector for the first beamlet and a second blanking deflector for the second beamlet; and a shield assembly having a first shielding element partially or fully surrounding the first blanking deflector.

According to an aspect of the present disclosure, a method for operating a charged particle beam device is provided. The method includes generating a primary charged particle beam; generating a first beamlet from the primary charged particle beam and a second beamlet from the primary charged particle beam; scanning the first beamlet and the second beamlet over a specimen; blanking the first beamlet with a first deflection field of a first blanking deflector for the first beamlet; and shielding the first deflection field of the first blanking deflector to reduce crosstalk to the second beamlet.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following.

DETAILED DESCRIPTION OF EMBODIMENTS

Figure 1A:
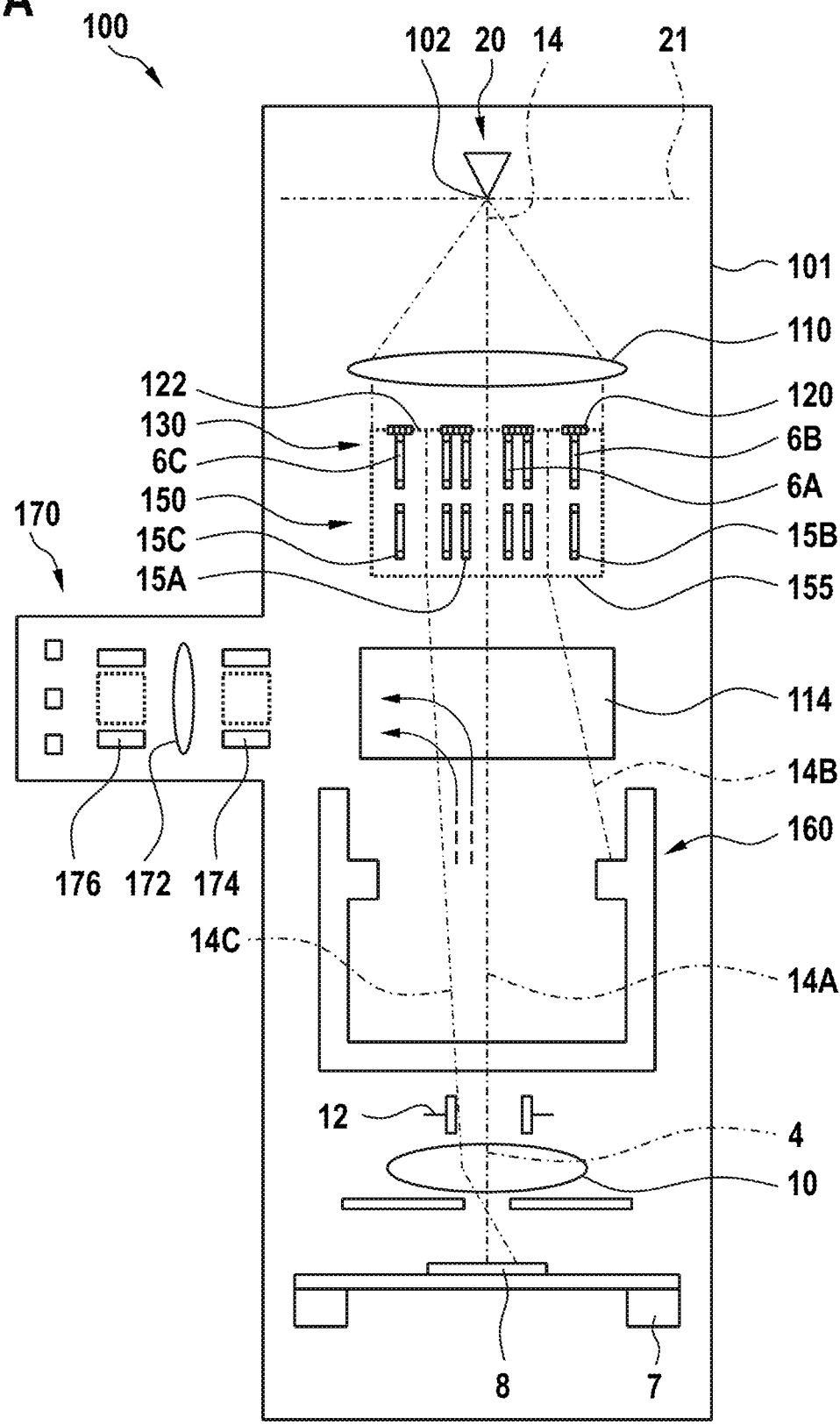
FIG. 1A shows a schematic view of a charged particle beam device according to embodiments described herein.

Reference will now be made in detail to the various embodiments of the disclosure, one or more examples of which are illustrated in the figures. Within the following description of the drawings, the same reference numbers refer to same components. Only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

Without limiting the scope of protection of the present application, in the following the charged particle beam device or components thereof will exemplarily be referred to as a charged particle beam device using electrons as charged particles. However, other types of primary charged particles, e.g. ions, could be used. Upon irradiation of a specimen or sample by a charged particle beam (also referred to as "primary charged particle beam"), signal charged particles, such as secondary electrons (SE), are created, which may carry information about the topography, chemical constituents and/or electrostatic potential of the sample and others. The signal electrons can include at least one of secondary electrons, backscattered electrons and Auger electrons. The signal charged particles can be collected and guided to a sensor, e.g., a scintillator, a pin diode or the like.

According to embodiments described herein, charging of non-conductive areas on the sample or specimen can be provided for an electron beam imaging apparatus, e.g. an electron beam inspection apparatus. A multi-beam blanker is provided, wherein primary charged particle beams or beamlets can be blanked individually. The beam blanking device may blank and unblank the electron beam(s). Each beamlet may be individually controllable, to maximize the throughput. As compared to beam blankers for e.g. lithography, the device should be fast, i.e. blank the beams in the microsecond range, i.e. less than the time scale to scan a single line. Further, blanking one beamlet should not affect the images obtained with the other beamlets, i.e. there should be no crosstalk between beam blanking elements.

According to embodiments of the present disclosure, a charged particle beam column having a source, i.e. a single source, is provided. A plurality of charged particle beamlets, i.e. primary charged particle beamlets, is generated within the charged particle beam column, for example, a single column having multiple beamlets. The plurality of charged particle beamlets is scanned over a specimen. Particularly upon scanning of an area at the border between an insulator and an area to be inspected, one of the plurality of beamlets may be scanned over the insulator while another of the plurality of beamlets is scanned over the area to be inspected. Scanning over an insulator, for example, a strong insulator, charging of the specimen may occur. The charging of the specimen may result in charging artifacts in the image to be provided. Accordingly, one or more of the beamlets scanning over the insulator can be blanked. Scanning of the other beams can be provided.

According to an embodiment, a multi-beam charged particle beam device is provided. The device includes a charged particle source configured to emit a primary charged particle beam; an aperture arrangement having openings configured to generate at least a first beamlet and a second beamlet of the primary charged particle beam; and a blanking device, the blanking device comprises; at least a first blanking deflector for the first beamlet and a second blanking deflector for the second beamlet; and a shield assembly having a first shielding element at least partially surrounding the first blanking deflector. The shield assembly is configured to reduce cross-talk from a first blanking deflector for a first beamlet to the second beamlet, i.e. a beamlet different from the first beamlet.

FIG. 1A shows a schematic view of a charged particle beam device 100 according to embodiments described herein. The charged particle beam device 100 can be an electron microscope, such as a scanning electron microscope (SEM). The charged particle beam device 100 includes a column having a column housing 101.

The charged particle beam device 100 includes a charged particle source 20 configured to emit a (primary) charged particle beam 14, a condenser lens arrangement 110, an aperture arrangement 120 configured to generate two or more beamlets 14A, 14B, 14C of the primary charged particle beam 14, and a multipole arrangement 130 configured to act on the two or more beamlets 14A, 14B, 14C, particularly to act on the first beamlet and the second beamlet separately. The aperture arrangement 120 includes a plurality of openings 122. A multipole arrangement 130 can be configured to act on the two or more beamlets. The condenser lens arrangement 110 can include a magnetic condenser lens or an electrostatic condenser lens, or a combined magnetic electrostatic magnet condenser lens. The magnification and/or the current of the beamlets can be controlled by the condenser lens arrangement.

According to some embodiments, which can be combined with other embodiments described herein, the condenser lens arrangement includes one or more condenser lenses, such as a single condenser lens or two or more condenser lenses. A condenser lens arrangement can be configured to provide a beam path with cross-over and/or a beam path without cross-over. The condenser lens arrangement 110 can have an adjustable lens excitation for at least one of changing a focal length and changing an illumination angle of the aperture arrangement 120. For example, the condenser lens arrangement can be provided with a controllable lens excitation for a focal length change enabling a variable source magnification and/or demagnification. Additionally or alternatively, the condenser lens arrangement can be provided with the controllable lens excitation for controlling the illumination angle of the aperture arrangement and/or the multipole arrangement (e.g., a deflector array). In some implementations, the condenser lens arrangement 110 can provide an essentially parallel illumination of the aperture arrangement 120.

The aperture array 120 separates the primary beam emitted by the charged particle source in primary beamlets. The aperture array can be considered as a portion of a beam splitter and may, for example, be at ground potential. The beam splitter separates the "main" beam into multiple beamlets. The multipole arrangement 130 can direct the beamlets to the coma free plane of the objective lens. The opening in the aperture arrangement 120 and, thus, the beamlets may be arranged in an array form or a ring form.

According to some embodiments, which can be combined with other embodiments described herein, one single charged particle source can be provided. The charged particle source 20 can be a high brightness gun. For example, the charged particle source 20 can be selected from the group including a cold field emitter (CFE), a Schottky emitter, a TFE, or another high brightness e-beam source. The source can be at a potential of −30 kV and the emitted electrons are accelerated to an energy of 30 keV by an extractor electrode and anode held at ground. The source can be configured to provide a uniform illumination to an angle of −40 mrad, e.g. at 30 kV extraction voltage.

The condenser lens arrangement 110 illuminates the aperture arrangement 120 with the (primary) charged particle beam 14, such as an electron beam. The resulting two or more beamlets 14A, 14B, and 14C can be deflected using deflectors 6A, 6B and 6C of the multipole arrangement 130 such that the two or more beamlets 14A, 14B, and 14C appear to come from different sources. For example, the electrons of the beamlets appear to be emitted from different locations in a plane 21 of the charged particle source 20 perpendicular to an optical axis 4. As shown in FIG. 1A, the electrons provided by the source appear to come from virtual sources.

According to some embodiments, which can be combined with other embodiments described herein, a beam separator 114, i.e., a separator separating the primary beamlets from the signal beamlets, can be provided by magnetic deflectors or a combination of magnetic and electrostatic deflectors, e.g. a Wien filter. A scanning deflector 12 may scan the beam or beamlets over the surface of the sample 8. The primary beamlets, i.e. the two or more beamlets, are focused on the specimen or sample 8 using a common objective lens. The primary beamlets can pass through one opening in the objective lens 10. The sample 8 is provided on a sample stage 7, which can be configured to move the sample 8 in at least one direction perpendicular to the optical axis 4. Due to the combined effects of the deflectors 6A-6C, e.g., electrostatic multipole devices, and the objective lens 10, multiple spots (images of the beam source 2), each corresponding to one of the beamlets are created on the specimen or sample 8.

A "sample" or "specimen" as referred to herein, includes, but is not limited to, semiconductor wafers, semiconductor workpieces, and other workpieces such as memory disks and the like. Embodiments of the disclosure may be applied to any workpiece on which material is deposited or any workpiece which is structured. Upon irradiation of the sample 8 by the electron beam, signal charged particles, such as secondary electrons (SE), are created, which may carry information about the topography, chemical constituents and/or electrostatic potential of the sample and others. The signal charged particles can be collected and guided to a detector device, which can be a sensor, e.g., a scintillator, a pin diode or the like.

According to some embodiments, which can be combined with other embodiments described herein, the objective lens 10 can be an electrostatic magnetic compound lens, particularly having an electrostatic lens that reduces the energy within the column from a high energy within the column to a lower landing energy. The energy reduction from the column energy to the landing energy can be at least a factor of 10, for example at least a factor of 30.

In some implementations, a retarding field including a potential provided to the sample 8 can be provided. According to yet further implementations, which can be combined with other embodiments described herein, a configuration, in which the column is at ground potential and the charged particle source 20 and the sample 8 are at a high potential can be provided. For example, most or all of the column components can be provided at ground potential.

As for instance shown in FIG. 1A, a plurality of or all primary beamlets can be scanned across the surface of the sample 8 using a common scanning deflector. According to some embodiments, which can be combined with other embodiments described herein, the scanning deflector 12 can be within the objective lens 10 or close to the objective lens 10. According to some embodiments, which can be combined with other embodiments described herein, the scanning deflector 12 can be an electrostatic and/or magnetic octupole.

The charged particle beam device 100 shown in FIG. 1A includes a signal electron optics. Particles released from or backscattered from the sample 8 form signal beamlets carrying information about the sample 8. The information can include information about the topography of the sample 8, the chemical constituents, the electrostatic potential, and others. The signal beamlets are separated from the primary beamlets using the beam separator 114. A beam bender (not shown) may optionally be provided. The beam separator can, for example, include at least one magnetic deflector, a Wien filter, or any other devices, wherein the electrons are directed away from the primary beam, e.g. due to the velocity depending Lorenz force.

Figure 1B:
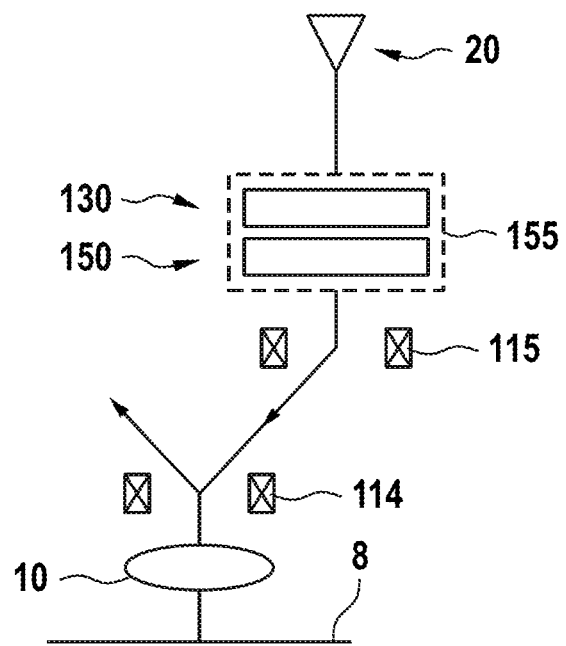
FIG. 1B shows a schematic view of a further charged particle beam device according to embodiments described herein.

FIG. 1B shows another beam path of the column including a beam separation between primary beamlets and signal beamlets. The beam separator 114 can be provided as a magnetic deflector. A further magnetic deflector 115 is provided. The two magnetic deflectors deflect the beamlets in opposite directions. The beamlets may be tilted by the first magnetic deflector 115 and aligned with an optical axis 4 of an objective lens (e.g. vertical in FIGS. 1A and 1B) by the second magnetic deflector. Signal beamlets return through the objective lens up to the beam separator 114 which separates signal beamlets from the primary beamlets.

The signal beamlets can be focused by a focusing lens 172. The focusing lens 172 focuses signal beamlets on detector elements of a detector assembly 170, such as sensors, scintillators, pin diodes or the like. For example, a detector assembly may include a first sensor to detect a first signal beamlet generated by a first beamlet and a second sensor to detect a second signal beamlet generated by a second beamlet. According to other embodiments, focusing of the secondary beamlets can be performed by a lens system which enables calibration of magnification and rotation. According to some embodiments, one or more deflectors 174, 176 are provided along the path of the signal beamlets.

According to embodiments described herein, a multi-beamlet column is provided with a number of beams, such as two or more, or 5 or more, or 8 or more, according to some examples, up to 200. The multi-beamlet column is configured such that the multi-beamlet column can also be arrayed in a multi-column system.

According to embodiments described herein, the pitch on the specimen, e.g. a wafer, i.e. a minimal distance between two primary beamlets on the specimen, can be 10 μm or above, for example 40 μm to 100 μm. Accordingly, embodiments provide a multi-beam device which generates a reasonable number of primary electron beamlets within one electron optical column, wherein crosstalk between the beamlets upon travelling through the column is reduced.

According to embodiments of the present disclosure, a multi-beam blanker is provided. FIG. 1A show a blanking device 150. The blanking device 150 can blank individual beamlets. For example, FIG. 1A shows the beamlets 14A, 14B, and 14C, wherein the beamlet 14B is blanked, and the other beamlets are unblanked. FIG. 1A shows the blanking device 150 downstream, for example, immediately after, the aperture arrangement 120. The blanking device 150 includes a plurality of blankers. FIG. 1A exemplarily shows blankers 15A, 15B, and 15C. For example, the blankers can be arranged on an array or a ring. The array form or ring form corresponds to the array form or ring form (or another form) of the openings 122 in the aperture arrangement 120. The blankers can turn each beamlet off and on. If a beam is blanked, it may be deflected radially outwards towards the beam stop 160. The beam stop may have one or more beam dumps.

According to embodiments of the present disclosure, the blanking device includes a shield assembly 155. The shield assembly reduces or avoids cross-talk. A blanker of one beam has reduced or substantially no (<$10^4$ orders of magnitude reduced) influence on another beamlet or the deflection of another beamlet, e.g. a neighboring beamlet. According to embodiments described herein, the blankers of the blanking device are fast and for being utilized in an imaging system, such as an EBI system, influence of fields generated by a blanker are strongly suppressed. Accordingly, blanking devices of, for example, lithography systems not having the significantly reduced cross-talk of the blankers may not be suitable for EBI.

According to some embodiments, which can be combined with other embodiments described herein, a blanking device for an EBI multi-beam system, particularly with individual beamlet blanking provides a fast blanking of a beamlet. For example, a beamlet can be blanked within 10 µs or below. For example, a blanking deflector, for example a first blanking deflector for a first beamlet and a second blanking deflector for a second beamlet can be controlled with signals provided by a plurality of lines to deflector elements, e.g. electrodes. The lines provide electrical signals to the deflector elements. According to some embodiments, which can be combined with other embodiments described herein, the lines can be high conductive and low capacitance lines. For example, the capacitance of the combination of lines and deflector element, i.e. deflector electrode, can be 100 pF or below. A resistance of the lines (or conductors) can be 200 Ohm or below. According to yet further embodiments, transient signals may be delimited to be within the µs region. According to some embodiments, which can be combined with other embodiments described herein, the first blanking deflector for the first beamlet and/or a second blanking deflector for the second beamlet are controlled by lines or conductors having a low resistance and low capacitance.

Embodiments of the present disclosure provide a multi-beam inspection column, wherein beamlets can be individually turned off and on. As exemplarily shown in FIG. 2, micro blankers of a blanking device 150 can be provided. Each micro blanker is configured to create an electrostatic dipole field per beamlet. When activated, the electrostatic dipole fields blank the beamlet, i.e. steer the beamlet away from the primary path into a beam-dump or aperture such that the blanked beamlet no longer reaches the wafer. Including a shield assembly according to embodiments of the present disclosure allows for a blanking operation not affecting the image produced by the non-blanked beamlets. The non-blanked beamlets remain on their original path.

According to embodiments of the present disclosure, and as exemplarily shown in FIG. 1A, the blanking device 150 can be located close (within 5 times to 15 times the length of the beam splitter (e.g. 10 times, such as 0.5*10=5 mm). A small distance between the beam splitter and the blanking device reduces alignment difficulties and may eliminate alignment deflectors between the two elements.

According to yet further embodiments, the blanking device can be provided at the same position along the optical axis as the beam splitter. For example, a multi-pole element can be provided, and having multiple electrodes are provided around a beamlets position. Some of the electrodes may serve for beam blanking and some of the electrodes may serve for beam splitting, i.e. generation of multiple charged particle spots on the specimen or generation of two or more virtual charged particle sources, respectively. According to yet further embodiments, which can be combined with other embodiments described herein, a blanking deflector, e.g. a first blanking deflector, includes a multipole device for splitting the first beamlet from the second beamlet and for blanking the first beamlet. According to yet further additional or alternative modifications, the multipole device can be controlled to additionally generate aberration correction fields, e.g. for correction of hexapole fields or for correction of astigmatism.

Figure 2:
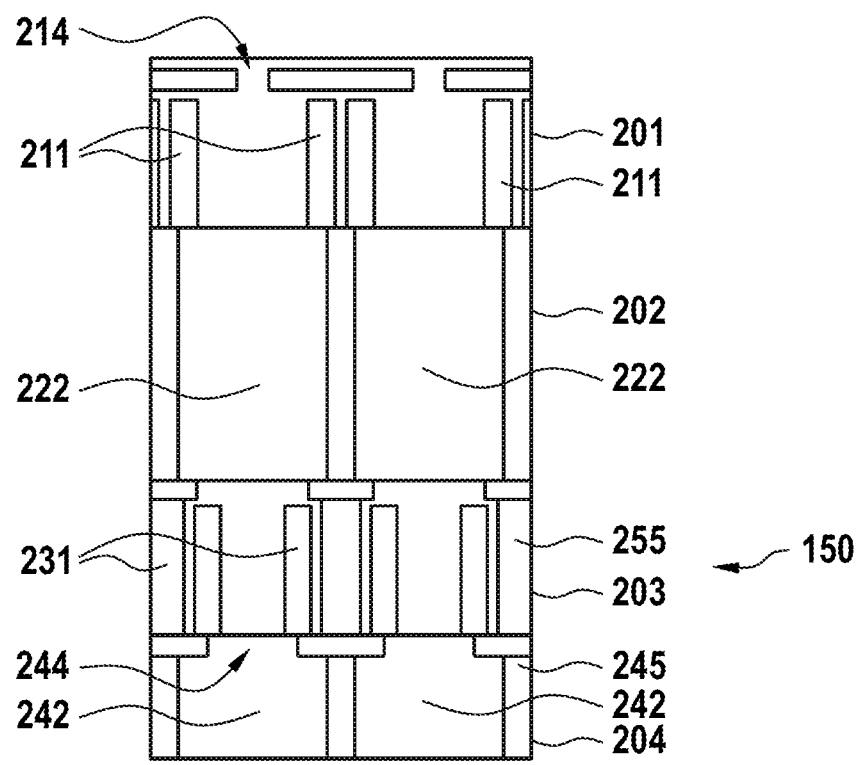
FIG. 2 shows a schematic view of a blanking device having a shield assembly according to embodiments described herein, wherein a beam splitter and a blanking device are provided.

An exemplary embodiment of an arrangement including an aperture assembly and a blanking device is shown in FIG. 2. A beam splitter, e.g. an aperture arrangement and deflector, can be provided by a first wafer 201. An active part including e.g. electrostatic deflectors of the beam blanker can be provided by a wafer 203. The wafer 203 can be connected, for example, physically connected to the beam splitter by wafer 202. For example, one bore 222 per beamlet can be provided. According to some embodiments, which can be combined with other embodiments described herein, a fourth wafer 204 may be provided. The fourth wafer 204 may also have a further bore 242 per beamlet. The 4 wafers can be accurately positioned and bonded together, e.g. with a lateral accuracy of <5 microns per wafer. The bores 222 in wafer 202 and the bores 242 in wafer 204 can include a conductive material or can consist of a conductive material. The wafers 202 and 204 can be grounded. The conductive material can act as a barrier for electrostatic cross talk between a blanked beam and neighboring beams.

According to some embodiments, which can be combined with other embodiments described herein, a blanking device can be provided on a first wafer and the shielding element, such as a second (further) shielding element can be provided on or by a second wafer. The second shield element and/or a third shield element may have a first bore diameter, and may further include one or more first apertures for a beamlet, e.g. a first beamlet, having a first aperture diameter different from the first bore diameter.

According to some embodiments, wafer 202 and/or wafer 204 can have the same length (wafer thickness) as the active blanking element, and may be made from a silicon wafer. This may result in easier manufacturing. Additionally or alternatively, and as exemplarily shown for the fourth wafer 204, an aperture 244 can be provided. The aperture 244 is provided, for example, additionally to the bore 242. FIG. 2 shows an aperture 244 at an upper side (one side) of the wafer 204. Apertures 244 can be provided at a first side, a second side, or both sides. The apertures are configured to further reduce crosstalk. According to some embodiments, which can be combined with other embodiments described herein, the aperture may be at least 1.5 times larger than a beam defining aperture of the wafer.

FIG. 2 shows the first wafer 201 having deflectors 211 and apertures 214. The bores 222 in wafer 202 and the bores 242 in wafer 204 provide shield elements 245 of a shield assembly 155 to reduce crosstalk. The wafer 203 includes blanking deflectors 231 to deflect the beam towards beam dump downstream of the blanking device. Further, shielding elements 255 are provided.

It is beneficial to separate dynamic and static electric signals. Accordingly, the deflectors 211 of the beam splitter and the blanking deflectors 231 of the blanking device can be provided according to some embodiments of the present disclosure. Voltages on the deflector 211 can be constant and the blanking deflectors can be used to steer the beamlet to the beam dump. For example, the blanker can have a stronger deflection field as compared to the beam splitter. Having a stronger blanking deflector is beneficial, as the beam dump may be located far enough from the primary beamlets, for example, to avoid contamination and/or charging of a region close to the beamlets. According to some embodiments, which can be combined with other embodiments described herein, the blanker electrodes of the blanking deflector 231 can be closer together as compared to the electrodes of the deflector 211. For example, embodiments described herein may have an opening between electrodes of the blanking deflector of 1 mm or below, such as 0.5 mm or below, particularly 0.25 mm or below. Additionally or alternatively, the blanking device may utilize larger voltages.

According to further embodiments, which can be combined with other embodiments described herein, an arrangement of a beam splitter and a blanking device may deviate from the example explained with respect to FIG. 2. For example, the second wafer 202 may not be provided and the wafer 201 and the wafer 203 may be bonded directly to each other. Additionally or alternatively, wafers may be unattached (not bonded) and vacuum may be provided between adjacent wafers.

Figure 3A:
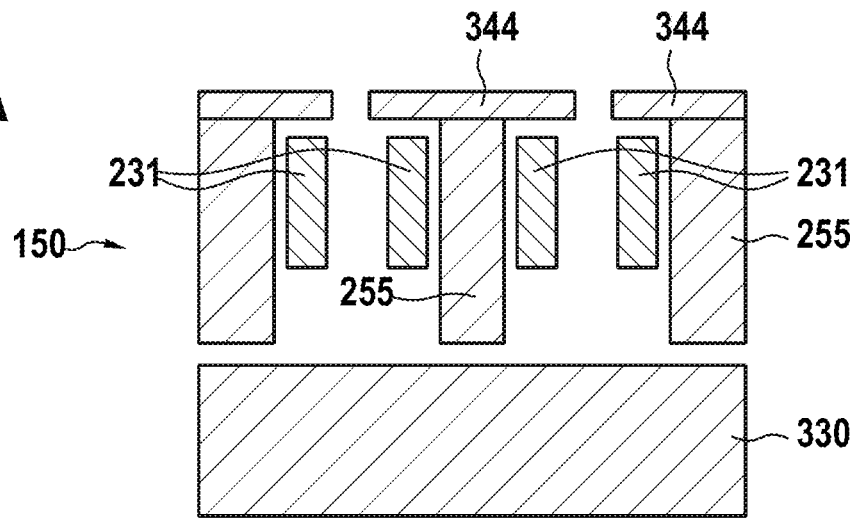
FIG. 3A shows a schematic view of a blanking device having a shield assembly according to embodiments described herein, wherein a further arrangement of a beam splitter and a blanking device is provided.

FIG. 3A shows an embodiment that may be combined with other embodiments described herein, wherein the blanking device 150 is upstream of the beam splitter 330. Further beam limiting apertures 344 can be provided. The beam-limiting apertures may reduce or prevent stray electrons falling on the blanking deflectors 231.

According to embodiments described herein, deflectors of a beam splitter and blanking deflectors can be provided per beamlet. For example, FIG. 3A shows blanking deflectors 231. The blanking deflectors include electrodes creating a dipole field to steer the beamlets towards a beam stop or beam dump that can be provided downstream (see for example FIG. 1A). Beam limiting apertures 344 are provided to reduce contamination and/or charging of the blanking deflectors. A bore 242 at shielding elements 255 is provided. The shielding elements 255 reduce crosstalk between the beamlets. According to some embodiments, which can be combined with other embodiments described herein, the blanking deflectors are provided between the shielding elements and/or can be surrounded by the shielding elements. For example, the blanking deflectors can be provided in a bore provided at the shielding elements. According to various embodiments, the beam splitter may separate the beamlets in the plane of the specimen, e.g. while the emitter tip of the charged particle source is imaged on the specimen. In other words, virtual sources may be generated in the plane of the charged particle source. Yet further, according to various implementations, the beam splitter can be provided by a plurality of multipole arrangement acting individually on beamlets in the column, by a lens acting on the beamlets, or by a combination of a lens an a multipole arrangement. For example, a lens may be arranged in a focus plane of the primary charged particle beamlets According to some embodiments, the lens may be an acceleration lens.

Figure 3B:
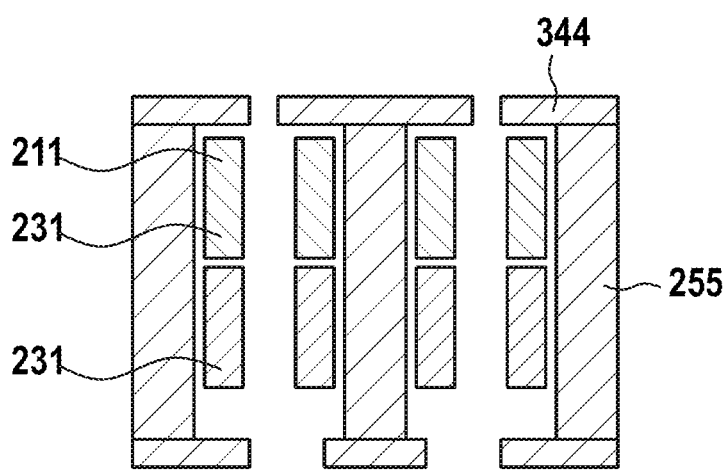
FIG. 3B shows a schematic view of a blanking device having a shield assembly according to embodiments described herein, wherein a further arrangement of a beam splitter and a blanking device is provided.

Another example of a blanking device can be described with respect to FIG. 3B. Deflectors 211 of a beam splitter and blanking deflectors 231 can be provided surrounded by shielding elements 255. As described above, blanking deflectors and deflectors of a beam splitter may be electrically isolated from each other and/or may provide different physical entities. Yet further, deflectors of a beam splitter can form a portion of the blanking device. For example, electrodes may be utilized as part of a deflector of a beam splitter and as a part of blanking deflectors 231. If crosstalk is generated by blanking, the crosstalk may be represented by a multipole analysis. Typically, the largest components will be a dipole or quadrupole (stigmation) crosstalk. This may be corrected if deflector electrodes as exemplarily shown in FIG. 3B are provided as octupoles.

As shown in FIG. 3B, a blanking device may be a part of a beam splitter. The deflectors 211 can be operated for beam splitting or may be activated together with the blanking deflectors 231 for blanking of the beamlets, particularly for individual blanking of the beamlets.

Figure 3C:
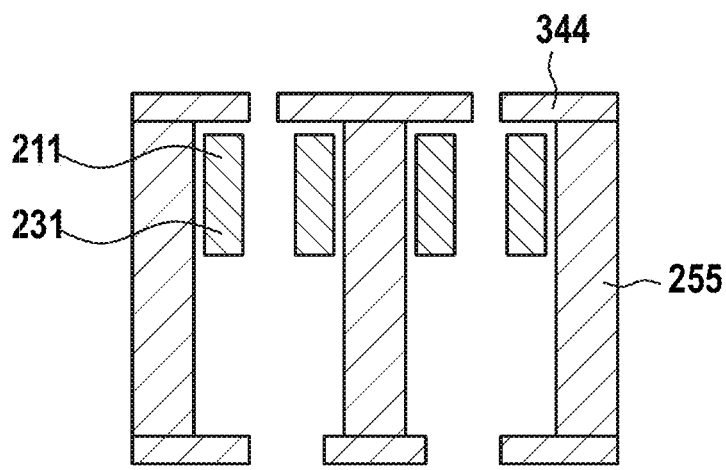
FIG. 3C shows a schematic view of a blanking device having a shield assembly according to embodiments described herein, wherein a yet further arrangement of a blanking device is provided.

As shown in FIG. 3C, a blanking device may be at the same position along an optical axis (same z-position) as a beam splitter. The deflectors can be operated for beam splitting or may be activated as blanking deflectors 231 for blanking of the beamlets, particularly for individual blanking of the beamlets. Fields for blanking and splitting can be superposed. Further, different deflectors having various positions in the same plane at a z-position may be utilized. Some of the deflectors may act as blanking deflectors and some of the deflectors may act as beam splitting deflectors. For example, a multipole device having shield elements can be provided. According to yet further additional or alternative modifications, the multipole device can be controlled to additionally generate aberration correction fields, e.g. for correction of hexapole fields or for correction of astigmatism.

Figure 4:
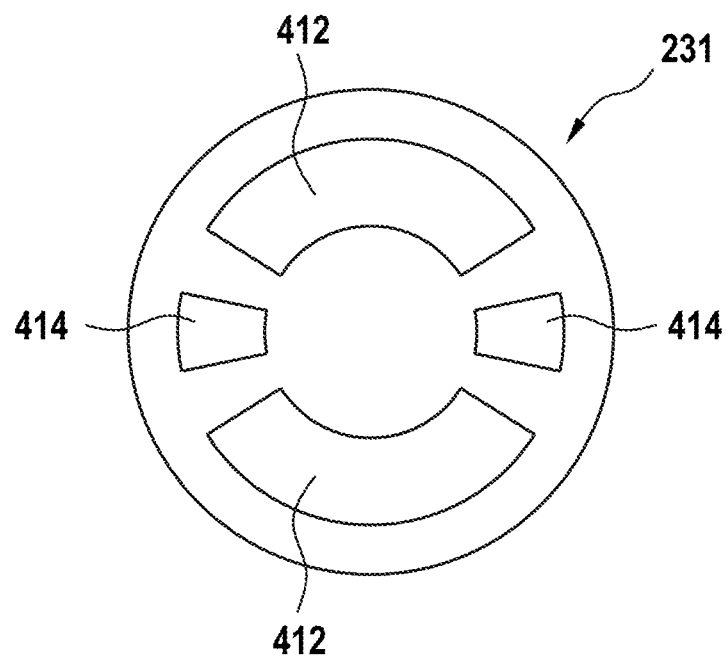
FIG. 4 shows a schematic view of a blanking deflector according to embodiments described herein.

An arrangement of electrodes of a blanking deflector 231 is schematically shown in FIG. 4. FIG. 4 shows a view along an optical axis of a beamlet. The blanker electrode 412 may be connected to a controller to be biased to opposite potentials. For example, the upper blanker electrode 412 may have a voltage of about +100V and the lower blanker electrode 412 may have a voltage of about −100 V. An antisymmetric voltage distribution is provided. As compared to a blanking deflector with a single electrode, this may be beneficial since the antisymmetric arrangement produces less astigmatism in the blanked beam. The size for beam dump or beam stop can, thus, be reduced. Further, a positive and negative voltage reduces the overall voltage as compared to a single electrode having, for example, a reference to ground. Accordingly, a similar deflection angle for beam blanking can be realized with reduced absolute voltages reducing the risk of arcing and/or provides easier vacuum feedthroughs. The blanking deflector 231 may further include adjustment electrodes 414. The adjustment electrodes may allow for beam adjustment during blanking or imaging. According to some embodiments, which can be combined with other embodiments described herein, insulators provided between the blanking deflector and/or the adjustment deflector or provided to support the blanking deflector and/or the adjustment deflector can be coated with a thin layer of carbon. For example, the thickness of the layer can be 100 nm or below and/or 5 nm or above, particularly 50 nm or below. The thin layer of carbon provides a high resistance layer and allows for reduction of charge build-up on the insulators. According to some embodiments, which can be combined with other embodiments described herein, a blanking device includes insulators having a carbon coating.

According to embodiments of the present disclosure, which can be combined with other embodiments described herein, the blanker electrode 412 may form an arc of about 120°. For example, an arc may be of at least 100° and/or at maximum 140°. A corresponding dipole field has reduced or no hexapole component. This may further reduce the size of the beam profile for a blank beam and allows for reducing the size of a beam dump or beam stop.

Embodiments of the present disclosure include the shield assembly having one or more of shielding elements surrounding blanking deflectors, shielding elements upstream and/or downstream of blanking deflectors, and shielding apertures, i.e. apertures with a reduced opening diameter as compared to bores in shielding elements. For example, a first shielding element can at least partially surround a blanking deflector of a first beamlet and the shield assembly may further include at least a second shielding element, e.g. a second shielding element or a second and a third shielding element, upstream (and/or downstream) of the first blanking deflector.

According to yet further embodiments, which can be combined with other embodiments described herein, a blanking device can have a length along the optical axis of 250 μm or above, for example 400 μm or above. The length of the blanking device having the shielding assembly further improves the reduced crosstalk.

Accordingly, crosstalk can be reduced by at least one order of magnitude as compared to known blankers and may be less than 0.1% or less than even 0.01%. Accordingly, blanking of one beamlet does not influence a neighboring beamlet. Further, the electrostatic deflectors shown herein are fast. Both advantages are particularly useful for electron beam inspection systems, wherein imaging of a specimen or a sample with a plurality of beamlets within one column is provided.

Figure 5A:
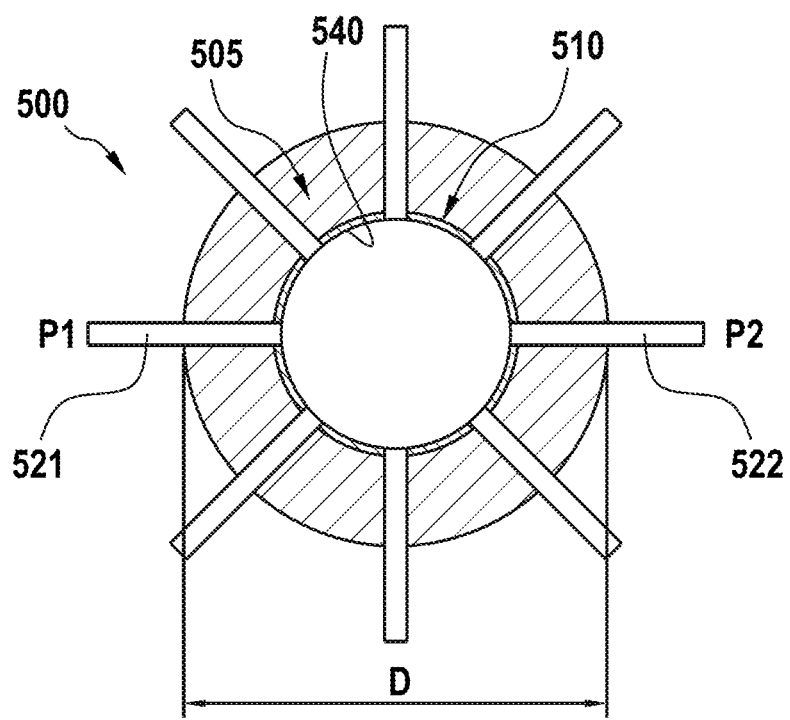
FIGS. 5A and 5B show schematic views of an electrostatic multipole device such as a blanking deflector according to embodiments described herein.

FIG. 5A shows an electrostatic multipole device 500 that can be used in embodiments described herein. The electrostatic multipole device 500 may be part of a blanking device 150 and can provide a blanking deflector 231 for a beamlet. For example, the electrostatic multipole device 500 can be provided as an octupole device. However, in some embodiments, the multipole device 500 may have less or more than eight electrodes.

The multipole device 500 includes a support device 505 which is at least partially coated with the high-resistance layer 510. In some embodiments, only a surface of the support device 505 which faces toward the optical axis is coated with the high-resistance layer. In some embodiments, one or more side surfaces of the support device 505 which may extend perpendicularly to the optical axis are coated with a high-resistance material. In some embodiments, the entire outer surface of the support device 505 may be coated with a high-resistance material, so that an accumulation of surface charges on the multipole device surface may be reduced or entirely avoided.

According to yet further implementations, which may optionally be provided for embodiments described herein, blanking deflectors may be coated with a thin layer of carbon, for example, having a thickness of 10 μm or below, such as 100 nm or below, such as about 20 nm. A thin layer of carbon has a high resistance allowing a voltage for blanking to be maintained and further allowing undesired charges (accidental currents from stray electrons) to drain away. For example, the outer surface of the support device may be entirely covered with a thin layer of a high-resistant material such as carbon, wherein the layer thickness can be in a range between 5 nm and 100 nm. Alternatively, the high-resistance layer can be 50 nm or below.

In some embodiments, which may be combined with other embodiments described herein, the support device 505 comprises a silicon wafer and/or a base plate made of an insulating material. In some embodiments, the support device 505 is at least partially coated with an insulating material, which may at least partially be coated with the high-resistance layer. In particular, the high-resistance layer may be coated onto an insulating surface. Such an arrangement may guarantee that a predetermined resistance between the individual electrical contacts is provided via the high-resistance layer.

In the embodiment shown in FIG. 5A, the support device 505 comprises an opening for the charged particle beam, wherein at least a cylindrical inner surface of the opening is coated with the high-resistance layer 510. Thus, the main surface 540 of the high-resistance layer 510 extends parallel to the optical axis A and may entirely surround the optical axis A, without any gaps or discontinuities along the circumferential direction.

In some embodiments, which may be combined with other embodiments described herein, the cylindrical inner surface of the opening extends over more than 0.2 mm and/or less than 5 mm, particularly over more than 0.5 mm and/or less than 2 mm in the direction of the optical axis A. In other words, the high-resistance layer 510 may extend parallel to the optical axis over more than 0.2 mm and/or less than 5 mm. Thus, a multipole electric field which is essentially homogenous in the propagation direction may act on the charged particle beam over a distance of more than 0.2 mm. The effect of fringe fields which may be present at the entrance and at the exit of the opening may be decreased by providing a long propagation distance within the opening.

The electrostatic octupole device shown in FIG. 5A includes eight electrical contacts, wherein each electrical contact contacts the high-resistance layer 510 at an associated circumferential position. The circumferential positions may be spaced apart at regular intervals of 45°. At least one of the electrical contacts, e.g. the first electrical contact 521 and/or the second electrical contact 522 may be provided as a conducting line which extends in a radial direction toward or on top of the high-conductive layer.

In some embodiments, the electrical contacts 521, 522 may be provided on at least one side surface of the support device 505, e.g. on the surface directed toward an entrance side (see FIG. 5B) of the opening and/or on the surface directed toward an exit side 154 (see FIG. 5B) of the opening. The side surface may have been previously coated with the high-resistance material.

Figure 5B:
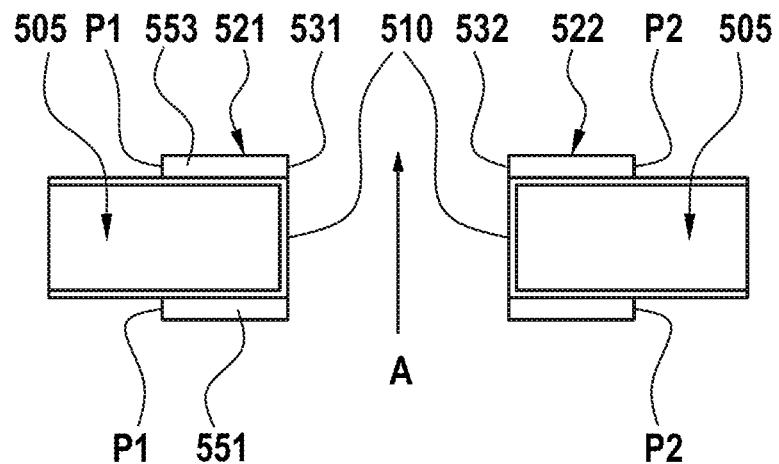

As can be seen in the sectional view of FIG. 5B, in some embodiments, at least one electrical contact includes a first conductive line 551 which radially extends at an entrance side (upstream side) of the cylindrical opening and a second conductive line 553 which radially extends at an exit side 154 (downstream side) of the cylindrical opening at a corresponding angular position. Both the first conductive line and the second conductive line may contact the high-resistance layer 510 at the first circumferential position 531. During operation, the first conductive line and the second conductive line may be connected to the first electrical potential P1. By providing the first electrical contact 521 with two conductive lines contacting the high-resistance layer at opposing sides of the opening, the main surface 540 of the high-resistance layer 510 may be held at an essentially constant potential P1 at the first circumferential position 531 from the entrance side through to the exit side. A second electrical potential P2 can be provided at a second circumferential position 532. As described above, according to some embodiments, the first potential P1 and the second potential P2 may be antisymmetric.

According to embodiments of the present disclosure, charge control can be provided for multi-beam charged particle beam devices by blanking of charged particle beams individually. Individual blanking for multi-beam charged particle beam devices increases the throughput, particularly for electron beam inspection, i.e. inspection of a wafer.

Blanking of charged particle beamlets can be provided by blanking device, and particularly by blanking device in combination with beam dump. A beam dump can provide a trap for charged particle beamlets and, beneficially, captures electrons of the primary beamlet. Further, reducing escaping electrons of the primary beamlet as well as number of escaping secondary electrons or backscattered electrons improves the performance of the multi-beam charged particle beam device.

Examples of common beam dumps may include a Faraday cup. A Faraday cup may be used to measure the current entering the Faraday cup. However, a Faraday cup may not be useful as a beam dump for multi-beam charged particle beam device.

A charged particle beam dump for a multi-beam charged particle beam device according to embodiments of the present disclosure includes an annular shaped body having an inner perimeter wall that defines an open annulus for trespassing of primary charged particle beamlets, the annular shaped body having an outer perimeter wall and a bottom wall. Further an annular shaped electrode provided partially above the annular shaped body is provided. The annular shaped electrode has an inner perimeter side and an outer perimeter side, wherein the inner perimeter side is outside of the radius of the inner perimeter wall of the annular shaped body.

Figure 7A:
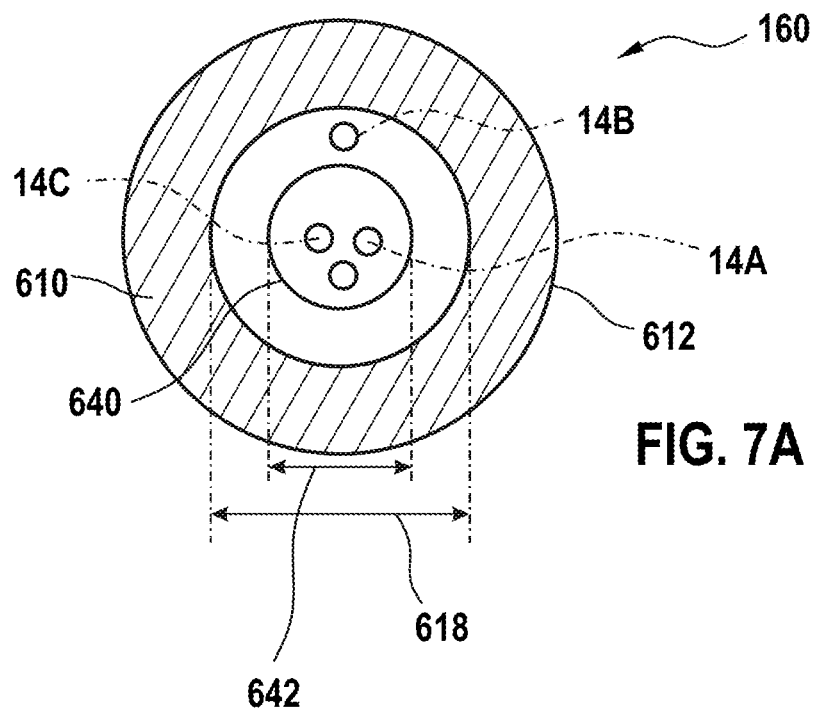
FIGS. 7A and 7B show schematic views of a beam dump according to embodiments of the present disclosure that may be used with a multi-beam charged particle beam device according to embodiments of the present disclosure.
Figure 7B:
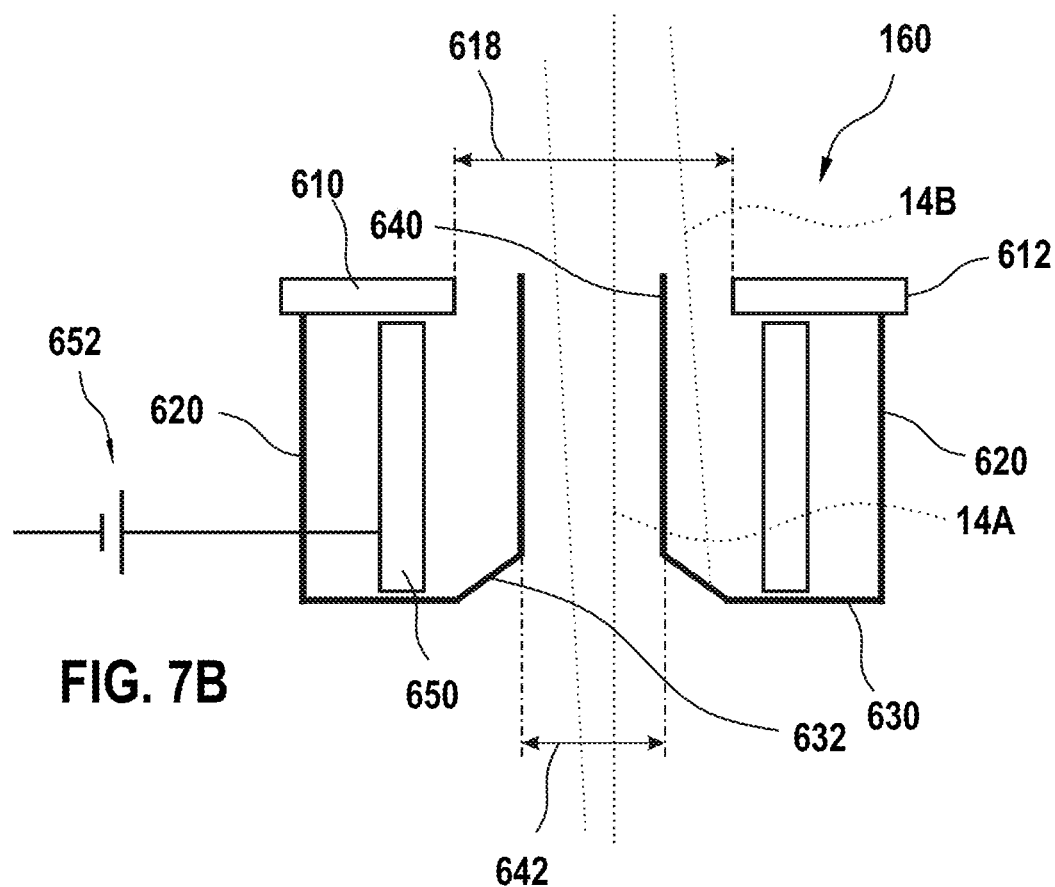

A beam dump 160 shown in FIGS. 7A and 7B, includes an annular shaped body. An inner perimeter wall 640 provides a center opening. Un-blanked beamlets, for example, beamlet 14A, can pass through the center opening. According to some embodiments, which can be combined with other embodiments described herein, an aperture plate with openings for individual beamlets may be provided in the center opening. A blanked beamlet, for example beamlet 14B, enters a ring-shaped opening. The ring-shaped opening can be provided between the inner perimeter wall 640 of the annular body and an inner perimeter side of an annular shaped electrode 610. The annular shaped electrode 610 can include the inner perimeter side and an outer perimeter side 612, opposing the inner perimeter side. The annular opening, i.e. the opening provided between the diameters 642 and the diameter 618 can be small as compared to the length of the beam dump 160, for example, the length along the optical axis. For example, the length of the beam dump 160 or of the annular body, respectively, can be at least five times the width of the annular opening ((diameter 618–diameter 642) times 0.5).

According to embodiments of the present disclosure, the terms "annular" and/or "annulus" is not delimited to describe circular structures. The geometry may also be slightly oval or polygon-shape, e.g. hexagonal or square. An annular structure can be described as ring-shaped, wherein a body has an outer perimeter wall and an inner perimeter wall defining an opening in the structure. Typically, a rotational symmetric shape can be beneficial. As such, a circular shape may be preferred as it provides the highest order of rotational symmetry.

According to some embodiments, the annular body has the inner perimeter wall 640, an outer perimeter wall 620, and a bottom wall 630. The bottom wall may close the annular shaped body at a bottom side of the angular shape body. According to some embodiments, which can be combined with other embodiments described herein, the bottom wall has an inclined surface. The inclined surface can be inclined radially outwardly. The bottom of the beam dump being inclined, i.e. specially angled, can serve to direct backscattered electrons or secondary electrons radial outwards to prevent the backscattered electrons or secondary electrons from escaping the beam dump.

As shown in FIGS. 7A and 7B, the outer perimeter side 612 of the annular shaped electrode 610 extends beyond the radius of the outer perimeter wall of the angular shape body. Alternatively, the outer perimeter side of the annular shaped body may extend up to the radius of the outer perimeter wall of the angular shape body. The annular shaped electrode partly closes the upper side of the angular shape body, for example, to trap charged particles in the beam dump.

According to some embodiments, which can be combined with other embodiments described herein, an electrode 650 is provided within the angular shape body. The electrode can be annular shaped, i.e. cylindrical or ring-shaped. The electrode can be provided fully or partially below the annular shaped electrode. As shown in FIG. 7B, the electrode 650 is connected to a power supply 652. The power supply is configured to bias the electrode to a positive potential, for example, 400 V or below, such as about 200 V. The electrode, such as the ring electrode assists to collect electrons, such as secondary or backscattered electrons, by generating an electric field that deflects electrons. The electric field of the electrode 650 can be shielded to the outside by the annular shaped electrode 610 and the walls of the angular shape body.

Since the blanked beam is confined in the angular shaped body and has high energy, it travels to the bottom of the annular shaped body without hitting a side wall. At the bottom of the beam dump, for example, the bottom wall 630, which may have the inclined portion 632, the primary beamlet interacts with the material and create secondary and/or backscattered electrons often energy larger 0 eV and with angles of 0° to 90°. The long narrow geometry of the beam dump allows only electrons with low radial angles to escape. As described above, the inclined portion 632 may increase radial angles. To reduce number of electrons escaping the beam dump, the electric field generated by the electrode 650 is provided. The combination of geometry and the electrode 650 allows for trapping electrons up to several kV.

According to some embodiments, which can be combined with other embodiments described herein, at least the bottom wall 630 or, for example, the bottom wall and the inner perimeter wall 640 can be supported by an insulating support. An insulating supports allows to measure the beam current of a beamlet impinging on the bottom wall or the bottom wall and the inner perimeter wall 640, respectively. Measuring of the beam current can be particularly beneficial for aligning of the charged particle beam device. A beamlet can be deflected into the beam dump while the beamlet current is measured. The beamlet current can be evaluated to determine whether the beamlet impinges e.g. on the bottom wall. For example, the deflection angle of the beamlet can be adjusted by verifying whether the beamlet impinges at the bottom wall. Accordingly, a method for operating a charged particle beam device may include generating a primary charged particle beam; generating a first beamlet from the primary charged particle beam and a second beamlet from the primary charged particle beam; scanning the first beamlet and the second beamlet over a specimen; and guiding the first beamlet with a first deflection field of a first blanking deflector into an annular shaped body of a charged particle beam dump. Further, the method may include calibrating a deflection angle to guide the first beamlet in the beam dump by measuring a current of the first beamlet in the beam dump.

According to embodiments of the present disclosure, the annular shape of the beam dump and/or the annular shaped of the opening at the upper side of the beam dump enables easy deflection of different beamlets of the multi-beam charged particle beam device into the beam dump. Further, the ring-shaped electrode in the annular shaped body facilitates collecting of electrons in the annular shaped body for multi-beam applications. According to some embodiments, which can be combined with other embodiments described herein, the angular shape may be particularly beneficial for aperture arrangements having openings provided on a ring, i.e. different beamlets providing on a ring.

According to some embodiments, which can be combined with other embodiments described herein, the deep beam dump may be provided downstream of the aperture arrangement and/or a beam splitter. For example, the beam dump can be provided at a position along the optical axis such that unplanned beamlets and blanked beamlets have a deflection of only a few mrads (e.g. 10 mrads or below). Yet further, additionally or alternatively the beam dump can be at the position of a common cross over of unplanned beamlets or a position, at which unplanned beamlets are close together.

According to yet further optional embodiments, an inner surface of the annular shaped body can be coated with a material reducing generation of backscattered or secondary particles. The yield of particles that may escape the beam dump can be reduced.

Yet further, the beam dump as described herein may be combined with blanking device having a shield assembly as described herein. According to some embodiments, the beam dump may also be provided for single-beam applications having a single charged particle beam, for example a single charged particle beam scanned over a specimen, such as a SEM.

Some embodiments of the present disclosure including a blanking device having a shielding assembly and/or a beam dump may refer to multi-beam applications or multi-beamlet applications, wherein two or more charged particle beams, such as electrons beams, are guided in one column. The multiple beams or beamlets can be scanned over a specimen. The specimen can be a wafer, e.g. during semiconductor manufacturing. Individual beams or beamlets can be blanked. Applications can include one or more applications from the group: electron beam inspection (EBI), hot spot (HS) inspection, critical dimensioning (CD) applications, defect review (DR) applications, mask inspection, and lithography. Lithography may have no detection or less sophisticated detection of signal beamlets. Beam blanking for individual beamlets may, however, also be applied for such other applications, e.g. lithography. Yet further, applications of multi-beam charged particle beam devices may include biomedical and biological applications Embodiments of the present disclosure may further relate to method for operating a charged particle beam device. The method includes generating a primary charged particle beam; generating a first beamlet from the primary charged particle beam and a second beamlet from the primary charged particle beam; scanning the first beamlet and the second beamlet over a specimen; guiding the first beamlet with a first deflection field of a first blanking deflector into an annular shaped body of a charged particle beam dump, particularly a charged particle beam dump according to embodiments of the present disclosure. Electrons can be attracted towards the electrode 650 in the annular shaped body of the beam dump. Further, charged particle beam devices may be trapped according to aspects, details and modifications described herein.

High throughput electron beam inspection (EBI) systems can utilize multi-beam charged particle beam devices, such as electron microscopes, that are able to create, focus and scan multiple primary charged particle beams or beamlets inside a single column of the charged particle beam device. A sample can be scanned by an array of focused primary charged particle beamlets, which in turn create multiple signal charged particle beams or beamlets. The individual signal charged particle beamlets can be mapped onto one or more detection elements. For example, the signal charged particle beamlets can be detected on-axis or, as is illustrated in FIG. 1A, off-axis. According to embodiments described herein, a blanking device 150 (see FIG. 1A) having a shield assembly 155 is provided. The shield assembly reduces crosstalk from a blanked beamlet to a neighboring beamlet. Further, a deflector or multipole device (see for example FIGS. 4, 5A and 5B) can be electrostatic and can be designed for fast blanking.

Figure 6:
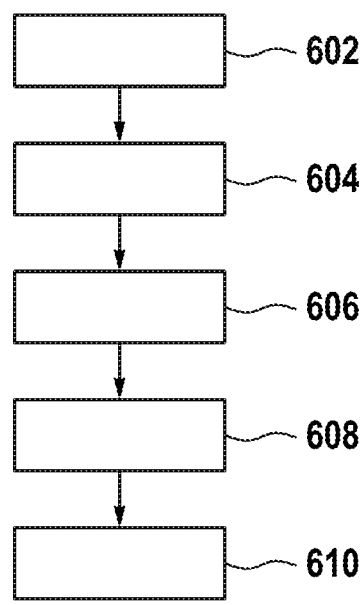
FIG. 6 shows a flowchart of a method for operating a charged particle beam device according to embodiments described herein.

Blanking of beamlets, i.e. individual blanking of one or more beamlets of a plurality of beamlets can be provided according to embodiments of methods for operating a charged particle beam device as exemplarily illustrated in FIG. 6. A primary charged particle beam is generated (see box 602), for example, with a charged particle source 20 (see FIG. 1A). A plurality of beamlets are generated by an aperture arrangement 120. For example, as illustrated by box 604, a first beamlet is generated from the primary charged particle beam and a second beamlet is generated from the primary charged particle beam. The first beamlet and the second beamlet are scanned over a specimen (see box 606). For example, the first beamlet and the second beamlet can be scanned in a synchronized manner by a scanning deflector 12 shown in FIG. 1A. A beamlet is blanked, e.g. deflected in beam dump. As illustrated by box 608, the first beamlet may be deflected or blanked with a first deflection field of a first blanking deflector for the first beamlet. The first deflection field of the first blanking deflector is shielded (see box 610) to reduce crosstalk to the second beamlet. Accordingly, one or more of the beamlets scanning over the insulator can be blanked. Scanning of the other beams can be provided.

As described above, according to some implementations, the first deflection field is generated by antisymmetric potentials applied to the first blanking deflector.

While the foregoing is directed to embodiments of the disclosure, other and further embodiments of the disclosure may be devised without departing from the basic scope thereof, and the scope thereof is determined by the claims that follow.

The invention claimed is:

1. A multi-beam charged particle beam device, comprising:
 a charged particle source configured to emit a primary charged particle beam;
 an aperture arrangement having openings configured to generate at least a first beamlet and a second beamlet of the primary charged particle beam; and
 a blanking device, the blanking device comprises:
  at least a first blanking deflector for the first beamlet and a second blanking deflector for the second beamlet; and
  a shield assembly having a first shielding element partially or fully surrounding the first blanking deflector, the first blanking deflector provided in a bore of the first shielding element.

2. The multi-beam charged particle beam device according to claim 1, wherein the shield assembly is configured to reduce cross-talk from the first blanking deflector to the second beamlet.

3. The multi-beam charged particle beam device according to claim 1, the shield assembly further comprises:
a second shielding element for the first beamlet upstream of the first blanking deflector.

4. The multi-beam charged particle beam device according to claim 3, wherein the blanking device is provided on a first wafer and the second shielding element is provided on or by a second wafer.

5. The multi-beam charged particle beam device according to claim 4, further comprising:
a multipole arrangement configured to act on the first beamlet and the second beamlet separately, wherein the multipole arrangement is provided on a third wafer, and wherein the first wafer, the second wafer and the third wafer are stacked on top of each other in an arbitrary order.

6. The multi-beam charged particle beam device according to claim 3, wherein the second shielding element has a first bore diameter, and further comprises one or more first apertures for the first beamlet having a first aperture diameter different from the first bore diameter.

7. The multi-beam charged particle beam device according to claim 1, the shield assembly further comprises:
a third shielding element for the first beamlet downstream of the first blanking deflector.

8. The multi-beam charged particle beam device according to claim 7, wherein the third shielding element has a second bore diameter, and further comprises one or more second apertures for the first beamlet having a second aperture diameter different from the second bore diameter.

9. The multi-charged particle beam device according to claim 1, wherein the first blanking deflector includes a multipole device for splitting the first beamlet from the second beamlet.

10. The multi-charged particle beam according to claim 9, wherein the splitting of the first beamlet and the second beamlet provides at least one of separate beamlet positions on a specimen or virtual sources of the first beamlet and the second beamlet in a plane perpendicular to an optical axis.

11. The multi-beam charged particle beam device according to claim 1, further comprising:
a multipole arrangement configured to act on the first beamlet and the second beamlet separately.

12. The multi-beam charged particle beam device according to claim 11, wherein the multipole arrangement is provided on a third wafer.

13. The multi-beam charged particle beam device according to claim 11, wherein the multipole arrangement and the blanking device are provided on a first wafer.

14. The multi-beam charged particle beam device according to claim 1, wherein the blanking device has a length along an optical axis of 250 µm or above.

15. The multi-beam charged particle beam device according to claim 1, further comprising:
a beam dump for the first beamlet and the second beamlet.

16. The multi-beam charged particle beam device according to claim 1, further comprising:
a detector assembly having a first sensor to detect a first signal beamlet generated by the first beamlet and a second sensor to detect a second signal beamlet generated by the second beamlet.

17. The multi-beam charged particle beam device according to claim 1, wherein the shield assembly further comprises a second shielding element for the first beamlet upstream of the first blanking deflector, and a third shielding element for the first beamlet downstream of the first blanking deflector.

18. The multi-beam charged particle beam device according to claim 1, wherein the first shielding element fully surrounds the first blanking deflector in a plane of the first blanking deflector.

19. A multi-beam charged particle beam device, comprising:
a charged particle source configured to emit a primary charged particle beam;
an aperture arrangement having openings configured to generate at least a first beamlet and a second beamlet of the primary charged particle beam; and
a blanking device, the blanking device comprising:
at least a first blanking deflector for the first beamlet and a second blanking deflector for the second beamlet; and
a shield assembly having a first shielding element partially or fully surrounding the first blanking deflector wherein the first blanking deflector includes an electrode having an arc of 100° or more.

20. A multi-beam charged particle beam device, comprising:
a charged particle source configured to emit a primary charged particle beam;
an aperture arrangement having openings configured to generate at least a first beamlet and a second beamlet of the primary charged particle beam; and
a blanking device, the blanking device comprising:
at least a first blanking deflector for the first beamlet and a second blanking deflector for the second beamlet; and
a shield assembly, including: a first shielding element partially or fully surrounding the first blanking deflector, a further first shielding element for the second beamlet and partially or fully surrounding the second blanking deflector, a further second shielding element for the second beamlet upstream of the further first blanking deflector, and a further third shielding element for the second beamlet downstream of the further first blanking deflector.

21. A method for operating a charged particle beam device, comprising:
generating a primary charged particle beam;
generating a first beamlet from the primary charged particle beam and a second beamlet from the primary charged particle beam;
scanning the first beamlet and the second beamlet over a specimen;
blanking the first beamlet with a first deflection field of a first blanking deflector for the first beamlet; and
shielding the first deflection field of the first blanking deflector to reduce crosstalk to the second beamlet, the first blanking deflector provided in a bore of a first shielding element.

22. The method according to claim 21, wherein the first deflection field is generated by antisymmetric potentials applied to the first blanking deflector.

* * * * *